US008993885B2

(12) United States Patent
Chang

(10) Patent No.: US 8,993,885 B2
(45) Date of Patent: Mar. 31, 2015

(54) HARDWARE RETAINER MOUNTED ON FACEPLATE

(71) Applicant: Nueteq Technology, Inc., Taipei (TW)

(72) Inventor: Hui-Chih Chang, Taipei (TW)

(73) Assignee: Nueteq Technology, Inc., Taipei (TW)

( * ) Notice: Subject to any disclaimer, the term of this patent is extended or adjusted under 35 U.S.C. 154(b) by 136 days.

(21) Appl. No.: 13/851,069

(22) Filed: Mar. 26, 2013

(65) Prior Publication Data

US 2014/0034351 A1    Feb. 6, 2014

(30) Foreign Application Priority Data

Aug. 6, 2012    (TW) .............................. 101215070 A

(51) Int. Cl.
*H02G 3/08* (2006.01)
*H05K 5/02* (2006.01)
*H02G 3/10* (2006.01)
*H02G 3/14* (2006.01)

(52) U.S. Cl.
CPC ............. *H05K 5/0221* (2013.01); *H02G 3/081* (2013.01); *H02G 3/10* (2013.01); *H02G 3/14* (2013.01)
USPC ................... 174/50; 174/53; 174/61; 174/62; 220/3.2; 220/3.3

(58) Field of Classification Search
USPC ......... 174/50, 53, 480, 481, 488, 503, 61, 62, 174/63, 484, 490, 66, 67, 541, 562; 220/3.2–3.9, 4.02, 241, 242; 361/600, 361/601, 609, 679.01, 679.02, 725
See application file for complete search history.

(56) References Cited

U.S. PATENT DOCUMENTS

| | | | |
|---|---|---|---|
| 5,190,241 A * | 3/1993 | Pease | 174/541 |
| 5,285,009 A * | 2/1994 | Bowman et al. | 174/482 |
| 6,259,604 B1 * | 7/2001 | Kuster | 361/725 |
| 6,501,020 B2 * | 12/2002 | Grant et al. | 174/50 |
| 6,797,879 B2 * | 9/2004 | Leyda et al. | 174/50 |
| 6,842,334 B2 * | 1/2005 | Smith et al. | 361/679.02 |
| 7,719,835 B1 * | 5/2010 | Schluter | 174/50 |
| 8,152,013 B2 * | 4/2012 | Hendricks | 174/562 |

* cited by examiner

*Primary Examiner* — Angel R Estrada
(74) *Attorney, Agent, or Firm* — Li & Cai Intellectual Property (USA) Office

(57) ABSTRACT

A hardware retainer detachably mounted on faceplate and selectively locked to a fixed body behind the faceplate includes a tray, at least two brackets and a faceplate box. The brackets are detachably mounted on the tray. The faceplate box is detachably mounted on the faceplate and is formed with a plurality of wire passages. The tray is detachably mounted on the faceplate box allowing for objects of varying dimensions to be installed on the faceplate.

13 Claims, 9 Drawing Sheets

HARDWARE RETAINER MOUNTED ON FACEPLATE

BACKGROUND

1. Field of the Invention

The instant disclosure relates to a hardware retainer mounted on a faceplate; in particular, to a hardware retainer which allows placement of articles thereon for space saving.

2. Description of Related Art

Multiple media transmission interfaces are currently available. RJ45, VGA to the recent DVI and HDMI are readily available. The transmission cable of the RJ45 is relatively thin and usually embedded within the building wall. Similarly, VGA cables can also be embedded within the building wall.

The fixedly embedded electrical conduits provide limited plug/receptacle combinations. However, different media devices employ different cable connectors. The connector for flat screen, television, projector or printer may vary. In a large cooperation, many recording devices connect to the same computer server and signals go through specialized transmission cables to various display units. Therefore a great variety of convertors emerges on the market to satisfy different coupling.

Conventional convertors lead the plug (e.g. RJ45) out of the electrical box through the faceplate. The plug is inserted to an inlet of the convertor. The signals travel through the convertor routing and are transformed into desired signal format (e.g. HDMI, DVI). The convertor then transmits the compatible signals to the display unit via cables. The signal transmission is successfully achieved by the convertor but the wires are not well organized or aesthetic.

To address the above issues, the inventor strives via associated experience and research to present the instant disclosure, which can effectively improve the limitation described above.

SUMMARY OF THE INVENTION

The object of the instant disclosure is to provide a hardware retainer detachably mounted on a faceplate to save space and couple to different electrical boxes.

According to one exemplary embodiment of the instant disclosure, the hardware retainer includes a tray, at least two brackets and a faceplate box. The brackets are detachably mounted on the tray. The faceplate box is detachably mounted on the faceplate and is formed with a plurality of wire passages. The tray is detachably mounted on the faceplate box.

The instant disclosure has the benefit of adjustable brackets which allows for coupling to different hardware components. The hardware retainer also helps to save space and organize the wires.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
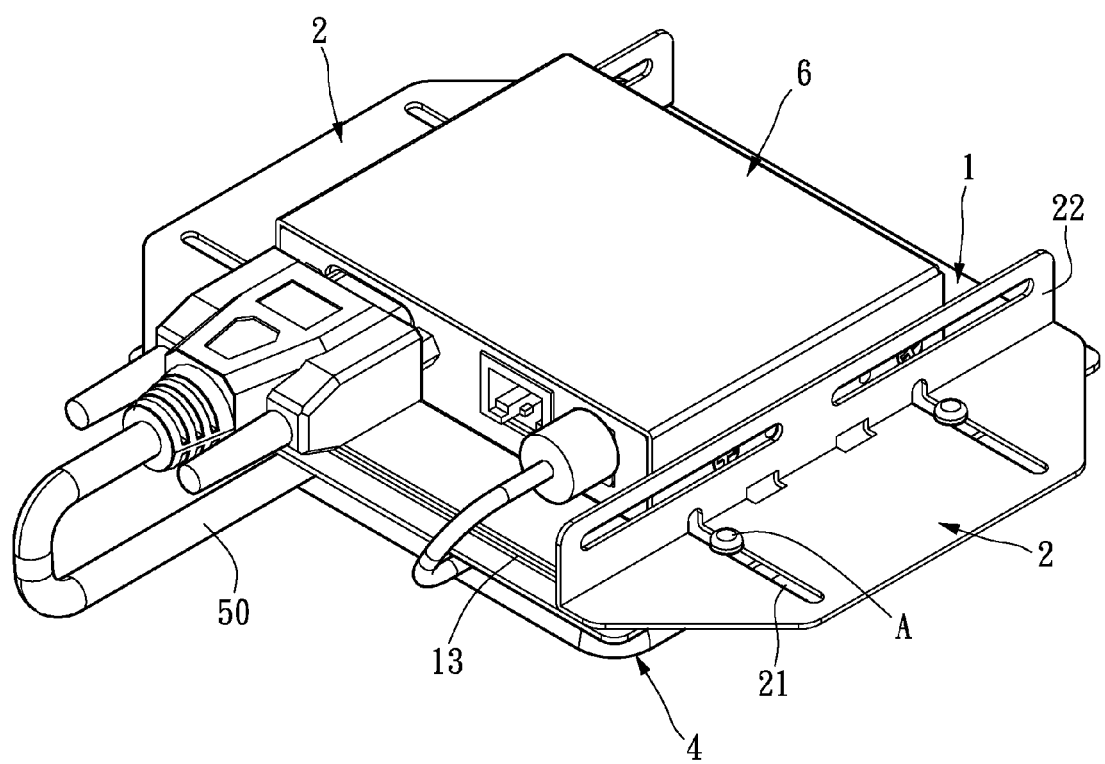
FIG. 1 illustrates a perspective view of a retainer mounted on faceplate in accordance with an embodiment of the instant disclosure.
Figure 2:
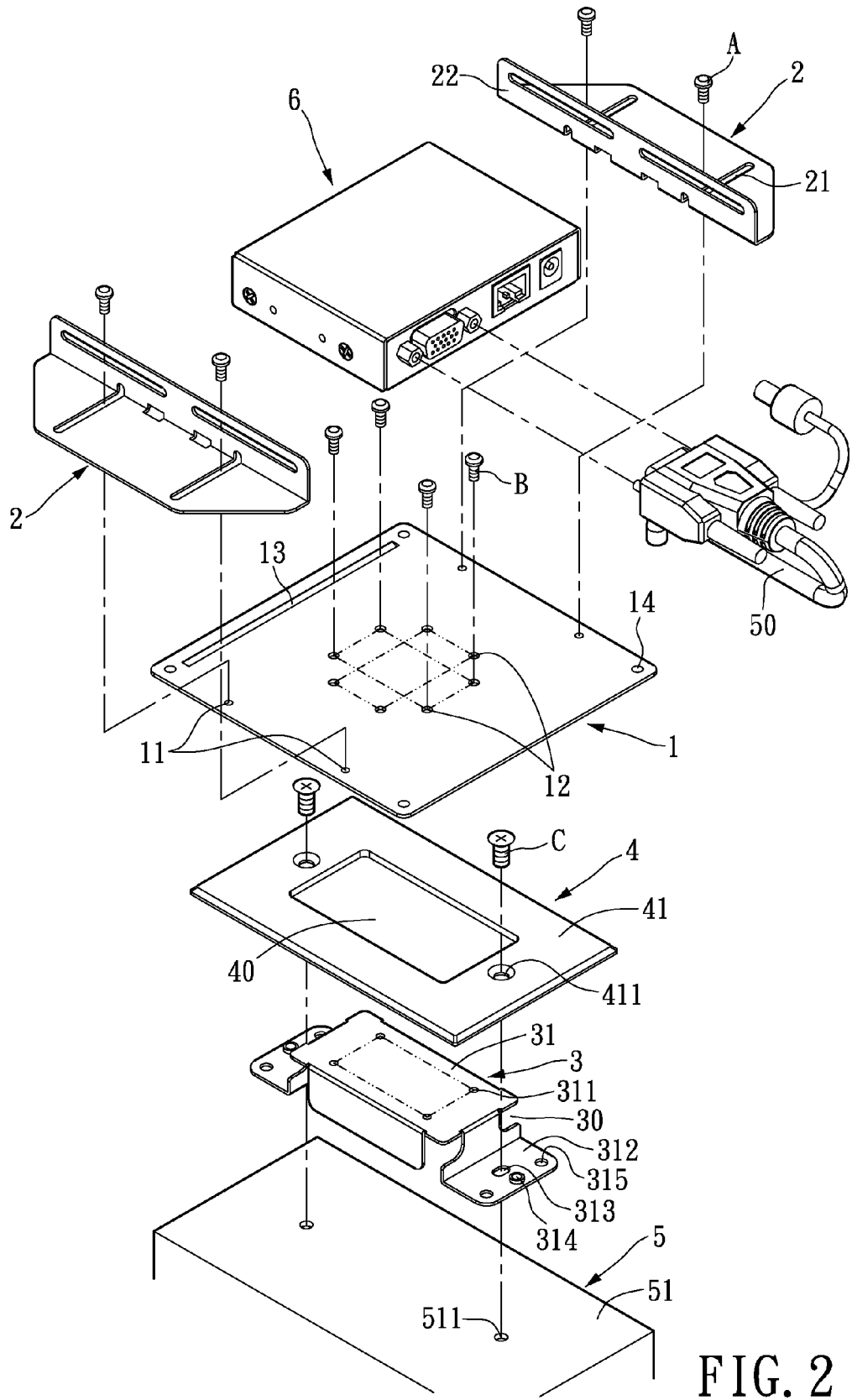
FIG. 2 illustrates a first exploded view of a retainer mounted on an American faceplate in accordance with an embodiment of the instant disclosure.

Attention is now invited to FIGS. 1~2 showing a first embodiment of the instant disclosure. The instant disclosure provides a retainer detachably mounted on a faceplate. The retainer includes a tray 1, at least two brackets 2 and a decora bracket 3 having a plurality of wire passages 30. The decora bracket 3 is detachably coupled to a faceplate 4 and the tray 1 is detachably mounted on the decora bracket 3. The two brackets 2 are detachably fastened to the tray 1. The decora bracket 3 can be sandwiched between a fixed body 5 and the faceplate 4. In other words, the electrical box cover 4, decora bracket 3 and fixed body 5 are fastened collectively in succession. The fixed body 5 and may be a wall or an electrical box. Each fixed body 5 can allow passage for at least one signaling wire 50 to go through. The tray 1 and the brackets 2 couple to the decora bracket 3 from an opening of the faceplate 4 therefore opposing the fixed body 5. The signaling wire 50 goes through one of the wire passages 30 then the faceplate 4 and connects to the convertor 6 which is retained by the tray 1 and brackets 2.

The tray 1 can be a substantially square metallic slab. At least two pairs of first apertures 11 are formed on the parallel edges of the tray 1. The centre region of the tray 1 has a plurality of second apertures 12. The second apertures 12 can be divided into two groups; each group has four apertures. The first group of the second apertures 12 defines a first rectangle while the second group of the second apertures 12 also defines a second rectangle with the same dimension as the first rectangle. Furthermore, the first and second rectangles perpendicularly overlap each other. The intersections of the rectangular diagonals fall at the centre of the tray 1. Additionally, the tray 1 is formed with thirteenth apertures 14 at four corners respectively. The thirteenth apertures 14 correspond to the layout of VISA holes behind a television so as to allow coupling. The tray 1 further includes a bump 13 to prevent falling of the convertor 6 when using magnetic attachment.

The two brackets 2, generally in L-shape, can be metallic plates and each thereof has at least two slots 21 which are parallel to each other while aligned perpendicular to a flange. When screws secure the brackets 2 atop the tray 1, the flanges 22 of the brackets 2 clamp an object from both sides. The slots 21 correspond to the first apertures 11 of the tray 1. The engagement between the bracket 2 and the tray 1 is coupled by a plurality of first screws A. Moreover, the elongated narrow slots 21 permit engagement at various positions along the track. In other words, the tray 1 and brackets 2 can retain devices (e.g. a convertor) with various sizes because the brackets 2 are adjustable.

In the instant embodiment, the fixed body 5 is an electrical box 51 satisfying the American electrical standard. The faceplate 4 and the decora bracket 3 are embodied by a faceplate 41 and a decora bracket 31 meeting the American electrical standard. The American standard faceplate 41 has a first opening 40 at the central region. The American standard decora bracket 31 resembles a rectangular metal box with a sideway/lateral opening and the widthwise sides extend to form tabs 312. When the electrical box 51, decora bracket 31 and faceplate 41 are engaged by screws, the decora bracket 31 fittingly projects through the first opening 40 while the electrical box 51, tabs 312 and faceplate 41 flush against each other in succession. The decora bracket 31 couples to the tray 1 by the projection portion which protrudes from the first opening 41. The decora bracket 31 is formed with four third apertures 311 conforming to the second apertures 12. Specifically, the third apertures 311 may correspond to the first or second group of the second apertures 12. Thus the tray 1 may have different orientations due to the alignment between the second and third apertures 12, 311.

Each of the tabs 312 is formed with a fourth aperture 313, a fifth aperture 314 and at least two seventh apertures 315. The fifth and seventh apertures 314, 315 are arranged substantially linearly in series. More specifically, the seventh apertures 315 are located symmetrically on either side of the fifth aperture 314. The fourth aperture 313 is located adjacent to the fifth aperture yet closer to the projection portion of the decora bracket 31. The faceplate 41 is formed with a pair of sixth apertures 411 on shorter sides thereof and the electrical box 51 is formed with a corresponding pair of fastening holes 511. Under assembling, the pair of sixth apertures 411, fourth apertures 313 and fastening holes 511 are aligned to receive fastening members. The decora bracket 31, faceplate 41 and electrical box 51 are collectively coupled by a plurality of third screws C via the aforementioned apertures.

Figure 3:
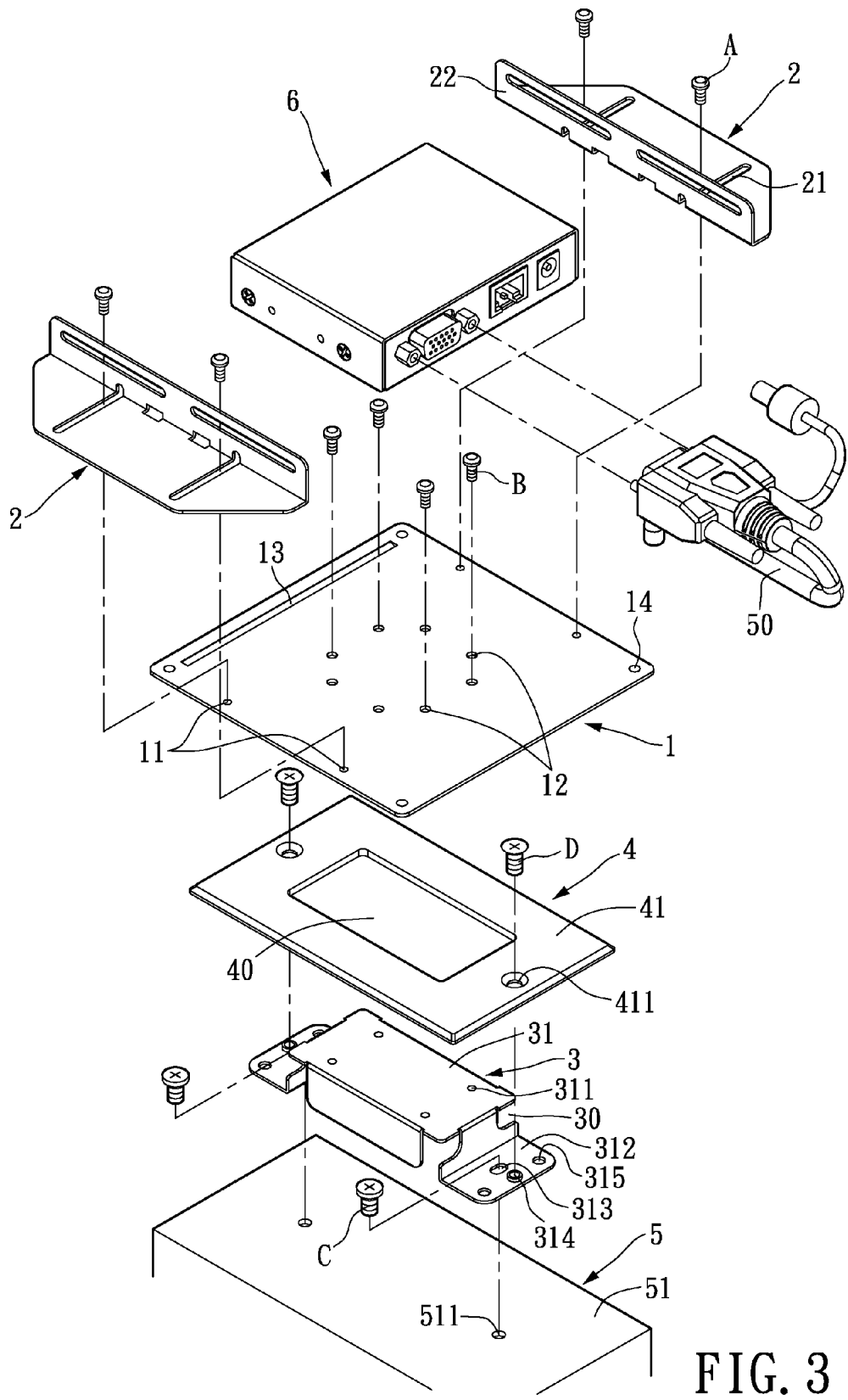
FIG. 3 illustrates a second exploded view of a retainer mounted on an American faceplate in accordance with an embodiment of the instant disclosure.

Attention is now invited to FIG. 3 showing a second embodiment of the instant disclosure. In the second embodiment, the sixth apertures 411 of the faceplate 41 correspond to the fifth apertures 314 of the tab 312. Therefore the fourth apertures 313 and first fastening hole 511 of the electrical box 51 are in alignment yet not the sixth apertures 411. Two fourth screws D are used to fasten the decora bracket 31 and faceplate 41 via the sixth apertures 411 and fifth apertures 314. On the other hand, the electrical box 51 and the American decora bracket 31 are engaged by the third screws C via the first fastening hole 511 and fourth apertures 313.

Figure 4A:
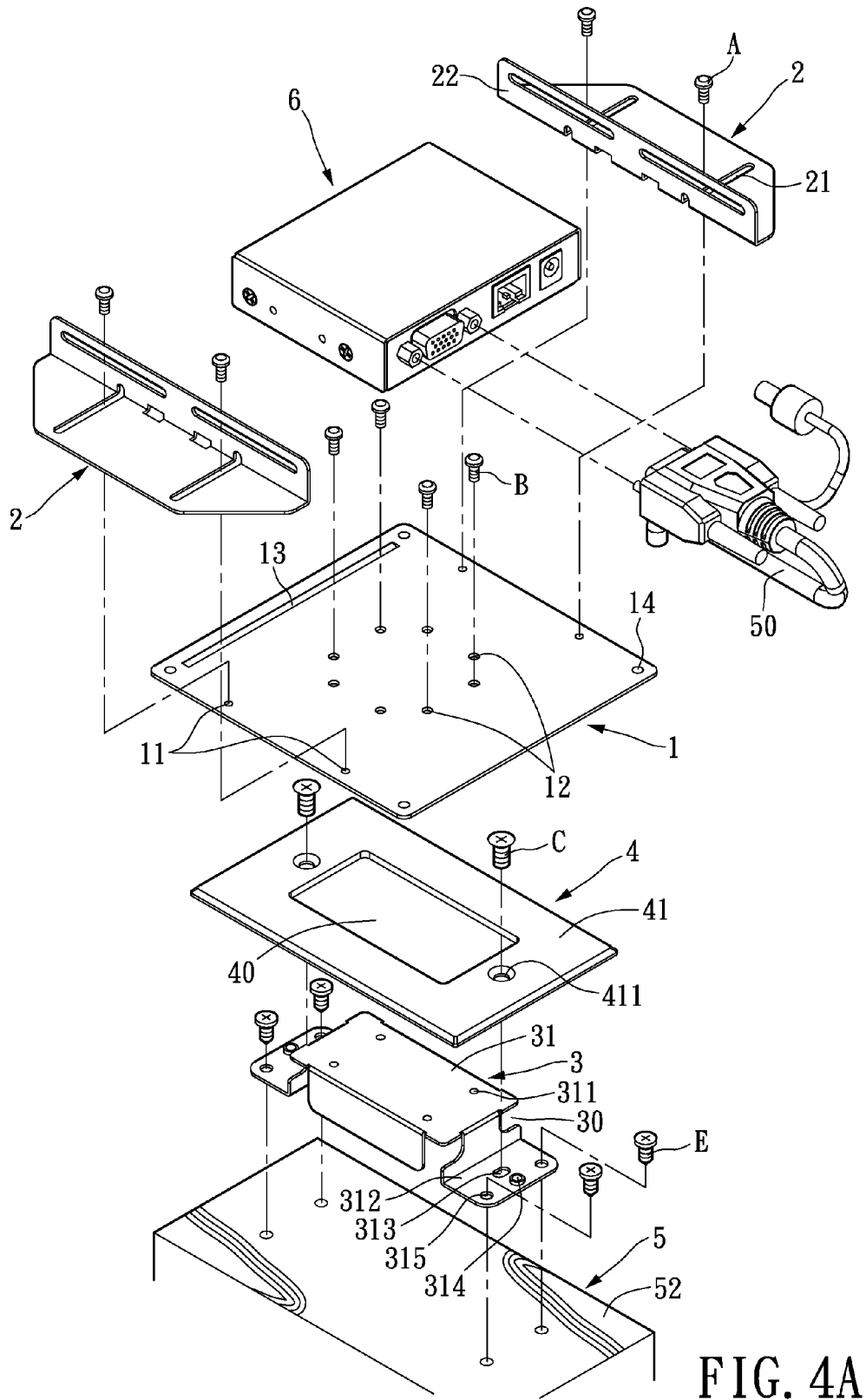
FIG. 4A illustrates a third exploded view of a retainer mounted on an American faceplate in accordance with an embodiment of the instant disclosure.
Figure 4B:
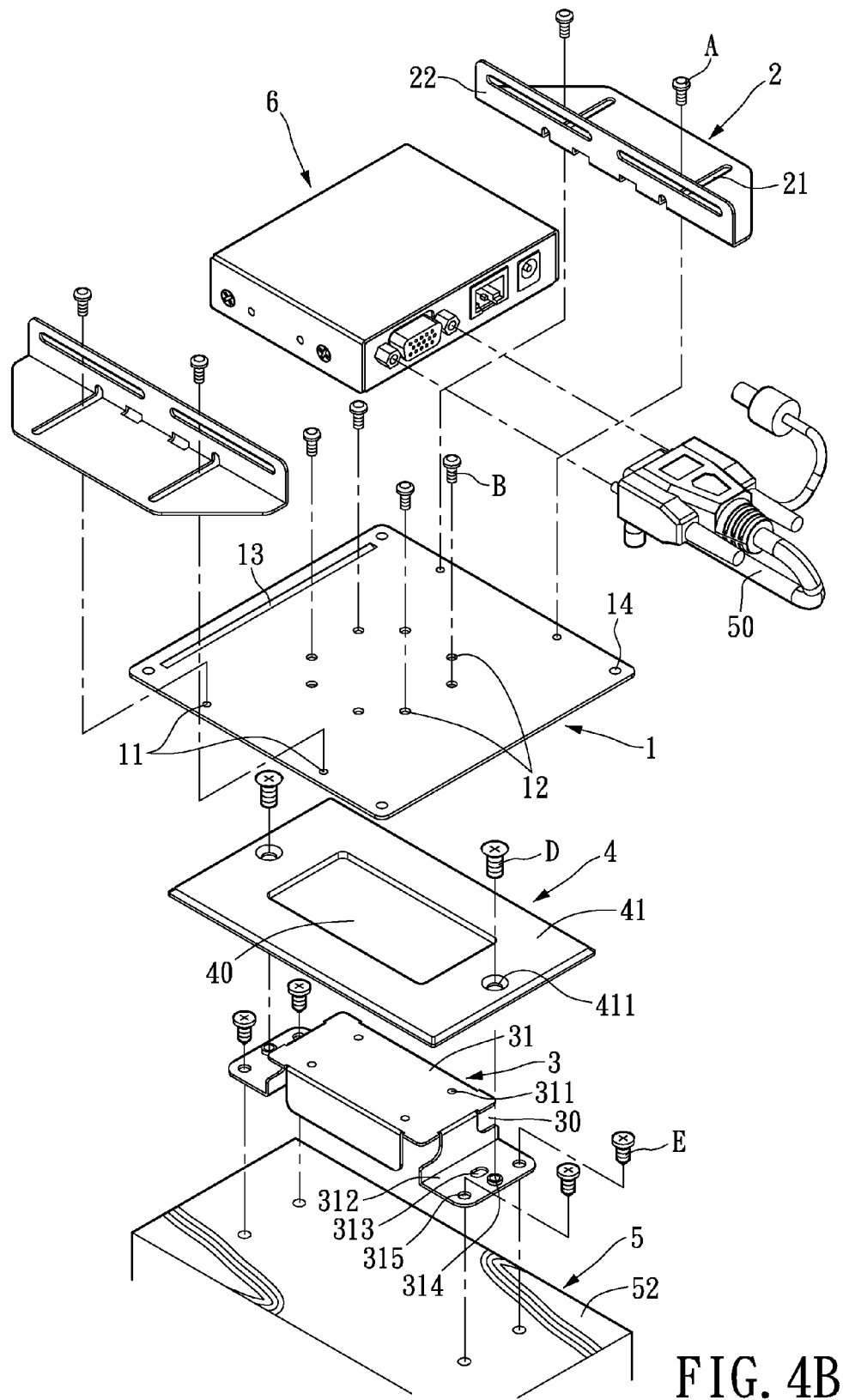
FIG. 4B illustrates a fourth exploded view of a retainer mounted on an American faceplate in accordance with an embodiment of the instant disclosure.

Attention is now invited to FIGS. 4A and 4B showing a third embodiment of the instant disclosure. The retainer can be mounted on the electrical box or wall. In the instant embodiment, the fixed body 5 is a wooden wall 52 without any apertures. The decora bracket 31 engages with the wooden wall 52 by a plurality of fifth screws E via the seventh apertures 315 of the tab 312. Moreover, the fourth and fifth apertures 313, 314 provide different options for securing the decora bracket 31 at the sixth apertures 411 on the faceplate 41 (referring to FIGS. 4A and 4B).

Figure 5:
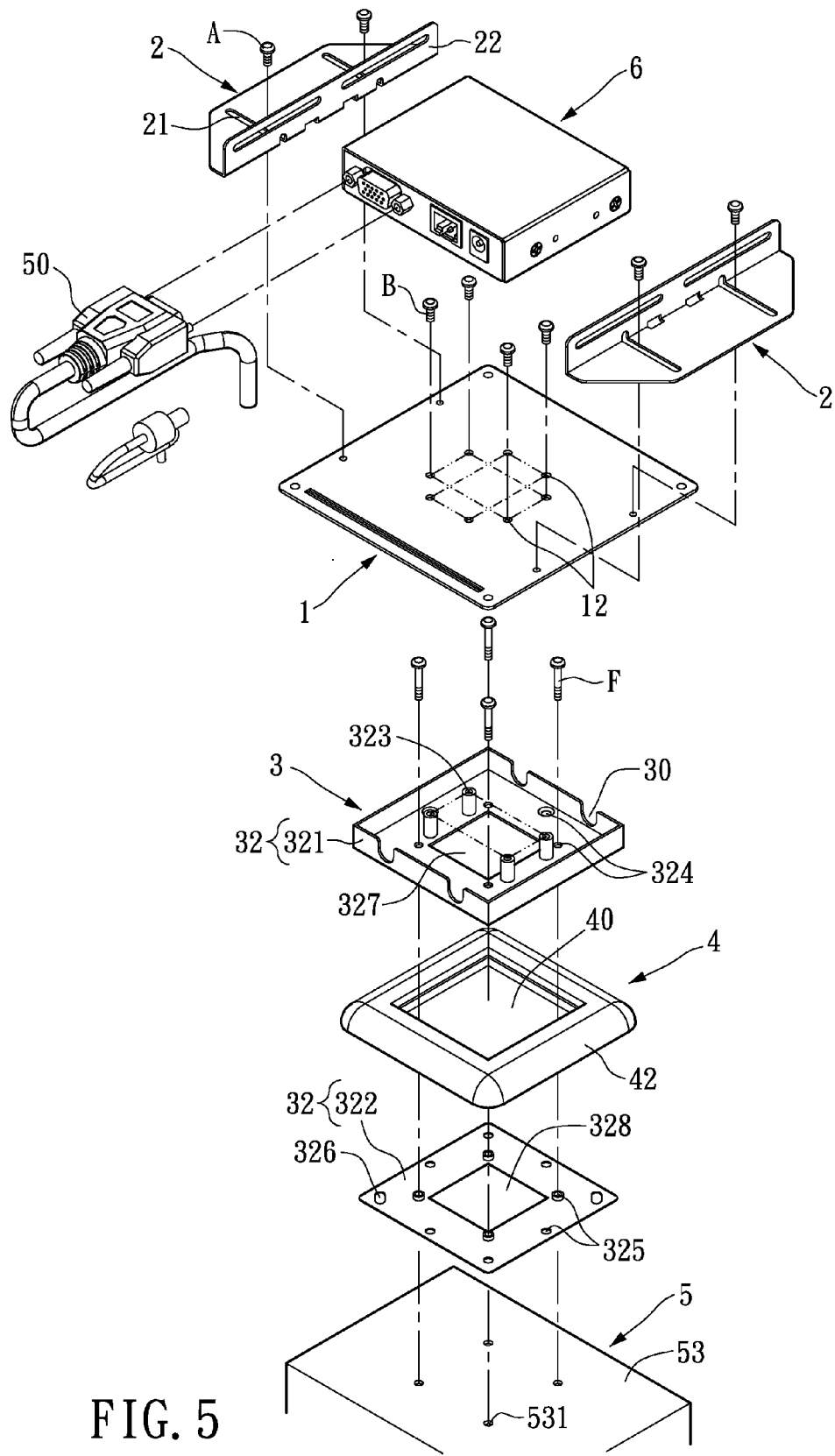
FIG. 5 illustrates a first exploded view of a retainer mounted on a European faceplate in accordance with an embodiment of the instant disclosure.

Attention is now invited to FIG. 5 showing a fourth embodiment of the instant disclosure. The difference among the aforementioned and fourth embodiments arises from the faceplate box 32, faceplate 42 and electrical box 53 which collectively satisfy European electrical standard. The faceplate box 32 is further divided into a main body 321 having a second opening 327 and a securing plate 322 having a third opening 328. The main body 321 and the securing plate 322 are metallic plates in accordance with the faceplate 42 in shape and size. The first opening 40 of the faceplate 42 permits access of the main body 321 coupling to the electrical box 53. The signaling cable 50 goes through the first, second openings 40, 327 and then the wire passage 30 to reach the convertor 6.

Similar to the faceplate box 31, the main body 321 is formed with four eighth apertures 323 conforming to the second apertures 12 of the tray 1. The tray 1 is allowed for two orientations by different alignments between the eighth apertures 323 and second apertures 12.

Furthermore, the faceplate box 32 is formed with four ninth apertures 324 disposed at the four corners of the second opening 327 respectively. In addition, another group of four ninth apertures 324 is separately disposed along the edge of the main body 321. Likewise, the securing plate 322 also has four tenth apertures 325 at four corners of the second opening 328 and another set of four tenth apertures 325 respectively disposed along the edge of the securing plate 322. Each of the ninth apertures 324 corresponds to one of the tenth apertures 325. Additionally, each corner of the securing plate 322 is formed with an eleventh aperture 326 respectively. In the instant embodiment, the electrical box 53 is formed with a plurality of second fastening holes 531 which also corresponds to one group of the ninth apertures 324 and engaged by fasteners.

Figure 6:
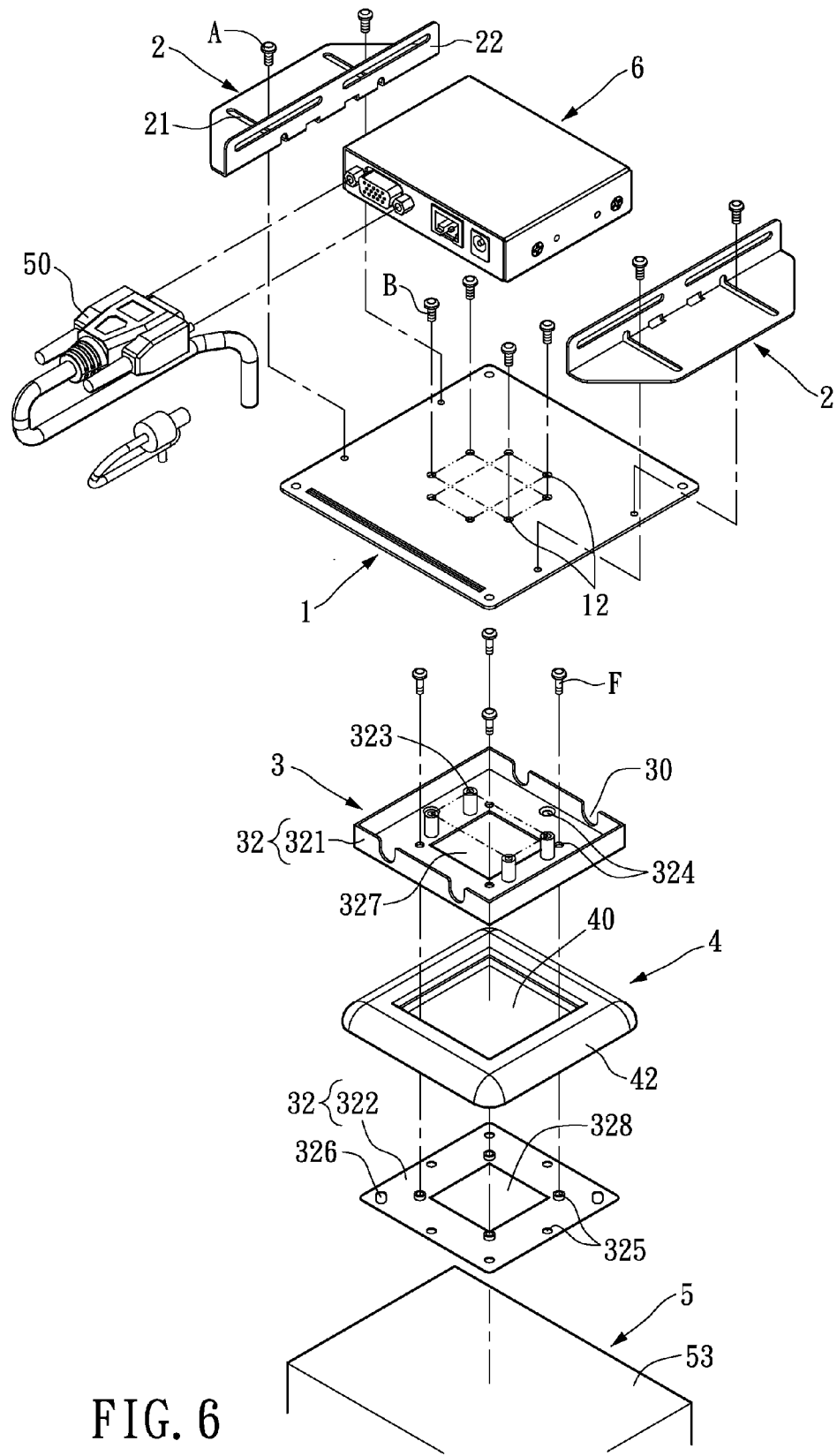
FIG. 6 illustrates a second exploded view of a retainer mounted on a European faceplate in accordance with an embodiment of the instant disclosure.

Attention is now invited to FIG. 6 showing a fifth embodiment of the instant disclosure. If the electrical box 53 does not have any fastening apertures for the faceplate box 32, the faceplate 42 serves the job of retaining the faceplate box 32. More specifically, fasteners go through the ninth apertures 324 as well as corresponding tenth apertures 325 and the faceplate 42 is sandwiched between the main body 321 and securing plate 322. The securing plate 322 is sandwiched between the faceplate 42 and the electrical box 53. That is to say the supporting of the electrical box 32 is provided by the faceplate 42 instead of the electrical box 53.

Figure 7:
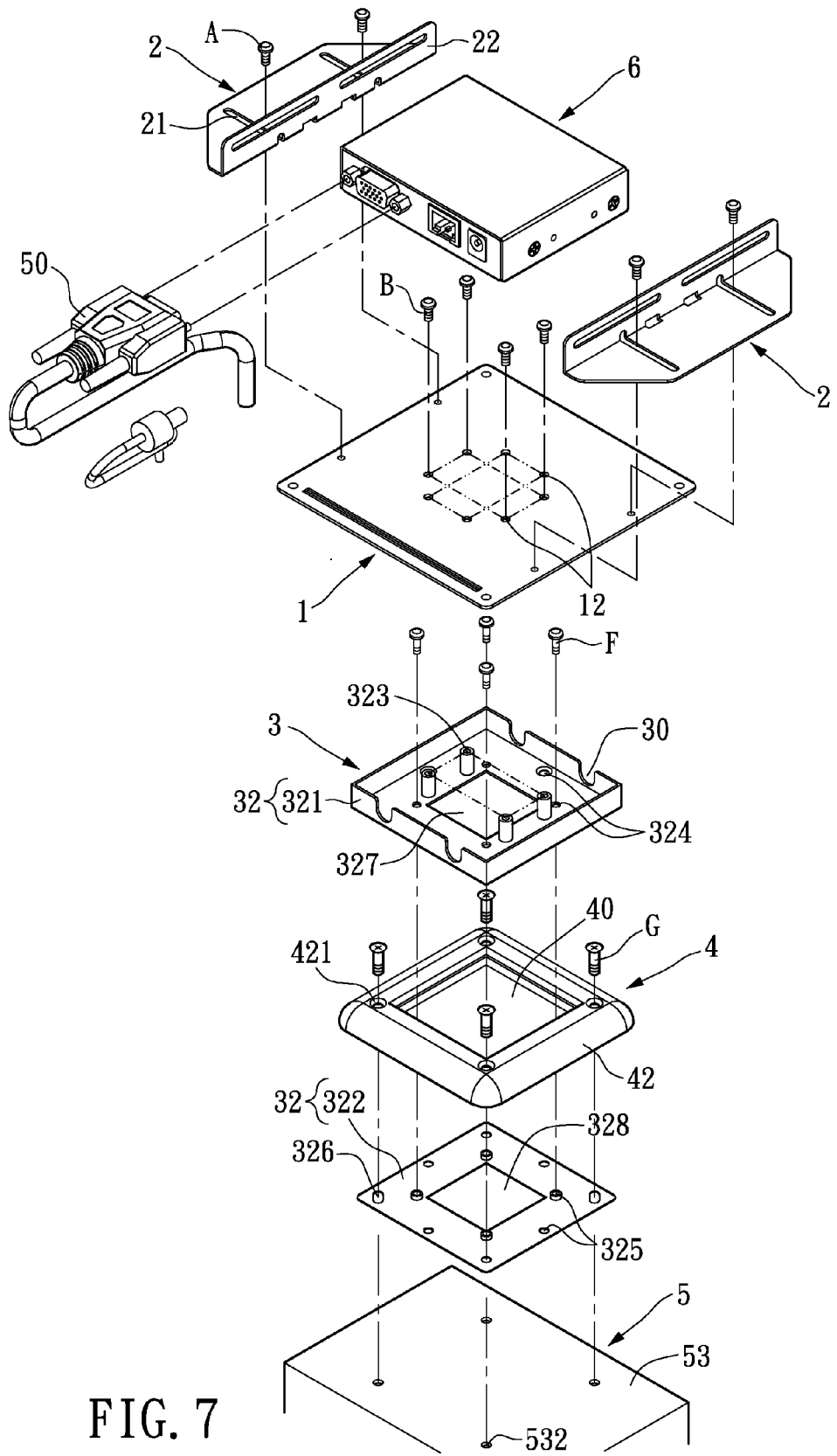
FIG. 7 illustrates a third exploded view of a retainer mounted on a European faceplate in accordance with an embodiment of the instant disclosure.

Attention is now invited to FIG. 7 showing a sixth embodiment of the instant disclosure. Each corner of the faceplate 42 is formed with a twelfth aperture 421. The electrical box 53 is formed with third securing holes 532 corresponding to each of the twelfth apertures 421. The twelfth apertures 421 are aligned with the eleventh apertures 326 of the securing plate 322. Upon assembling, the electrical box 53, faceplate 42 and securing plate 322 are collectively coupled by fasteners via the conforming eleventh, twelfth apertures 326, 421 and third fastening holes 532. The main body 321 and securing plate 322 are coupled by fasteners via the ninth apertures 324 and the tenth apertures 325.

Figure 8:
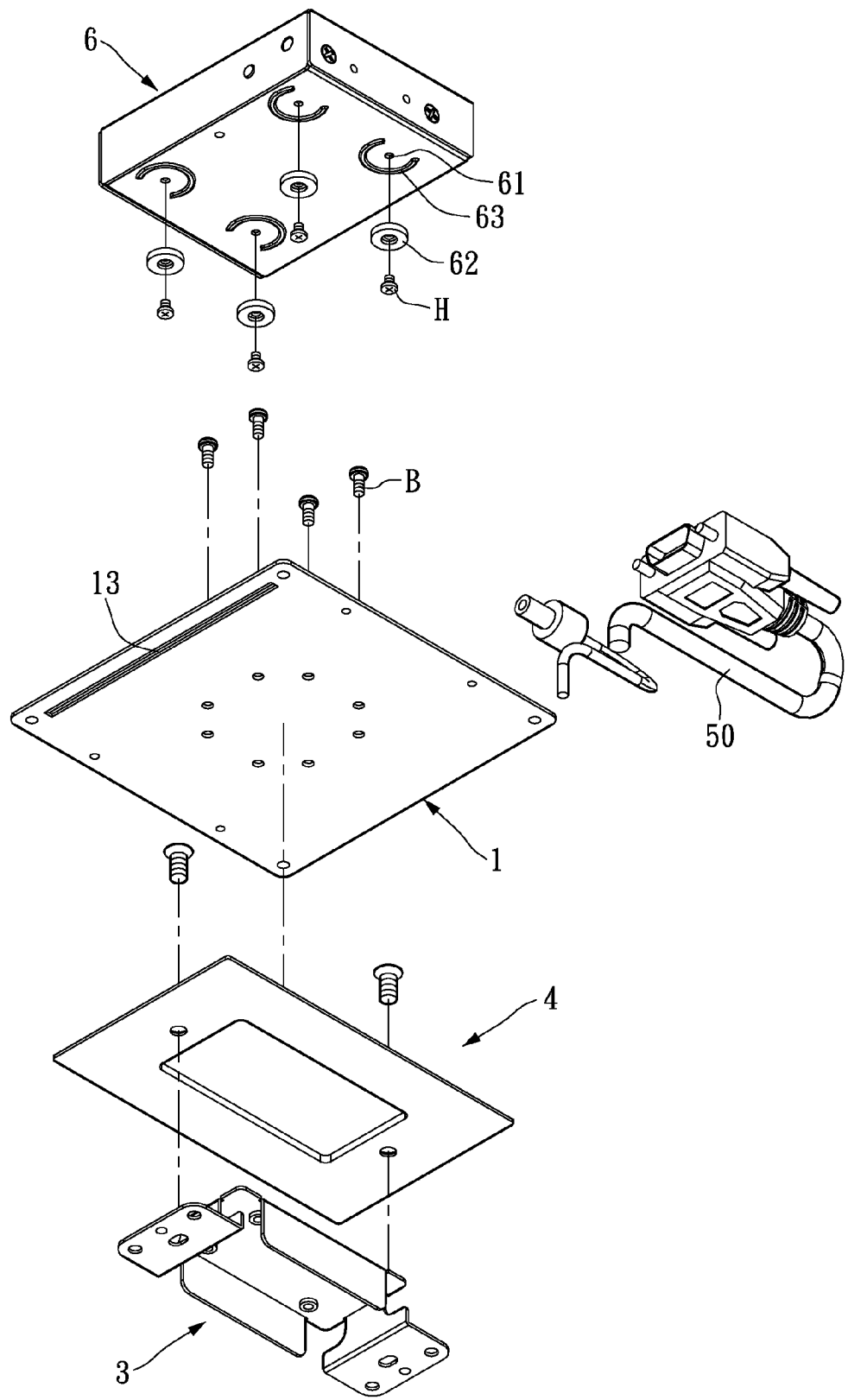
FIG. 8 illustrates a schematic view of a retainer mounted on a faceplate by magnet.

Attention is now invited to FIG. 8 showing a seventh embodiment of the instant disclosure. The rectangular convertor 6 has four magnet fastening portions 61 locating at the four corners respectively and four corresponding magnets 62. The magnets 62 are fastened to the magnet fastening portions 61 by fasteners. Each of the magnet fastening portions 61 has a circular rib 63 to facilitate positioning of the magnets 62. In the instant embodiment, the convertor 6 couples to the tray 1 by magnets 62 so the brackets 2 (as shown in FIG. 1) are not needed in this case. In other words, the convertor 6 is retained primarily by magnetic force between the metallic tray 1 and magnets 62. The bump 13 further prevents the convertor 6 from sliding off the tray 1.

In summary, the tray, brackets and the faceplate box retains hardware over the faceplate. The hardware can be a convertor so the retainer helps to organize the wires and provides stable attachment. The elongated and narrow slots allow the position of brackets being adjustable to suit the dimension of the hardware. In addition, the tray and faceplate box are formed with a plurality of apertures therefore permitting universal electrical box matching including the American and European electrical standards. The plurality of apertures also provides more options of different tray orientations over the faceplate box.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A hardware retainer detachably mounted on a faceplate and selectively coupled to a fixed body, comprising:
    a substantially rectangular faceplate box formed with a plurality of wire passages and detachably mounted on the faceplate;
    a tray detachably mounted on the faceplate box; and
    at least two brackets detachably mounted on the tray;
    wherein the brackets clamp a convertor there-between;
    wherein the tray includes a bump, the convertor includes magnet fastening portions arranged at each corner thereof, and magnets are disposed on the magnet fastening portions.

2. The hardware retainer according to claim 1, wherein the tray is formed with at least two first apertures and a plurality of second apertures, each of the brackets is formed with at least two slots corresponding to the first apertures, and the tray and the brackets are coupled by fasteners going through the first apertures and the slots.

3. The hardware retainer according to claim 2, wherein the faceplate box has two tabs extending widthwise there-from and a plurality of third apertures selectively corresponding to the second apertures for engagement by fasteners.

4. The hardware retainer according to claim 3, wherein the fixed body is formed with two first fastening holes, the tabs are formed with a pair of fourth apertures and a pair of fifth aperture, the faceplate is formed with a pair sixth apertures, and the fourth apertures correspond to the first fastening holes for coupling by fasteners.

5. The hardware retainer according to claim 4, wherein the fourth apertures correspond to the sixth apertures for coupling by fasteners.

6. The hardware retainer according to claim 4, wherein the fifth apertures correspond to the sixth apertures for coupling by fasteners.

7. The hardware retainer according to claim 3, wherein the fixed body is a wooden wall, each of the tabs is formed with at least two seventh apertures for coupling to the fixed body by fasteners.

8. The hardware retainer according to claim 2, wherein the faceplate box includes a main body and a securing plate, the main body is formed with a plurality of eighth apertures and a plurality of ninth apertures, and the eighth apertures selectively correspond to the second apertures for coupling by fasteners.

9. The hardware retainer according to claim 8, wherein the fixed body is formed with a plurality of second fastening holes selectively corresponding to the ninth apertures for coupling by fasteners.

10. The hardware retainer according to claim 9, wherein the securing plate is formed with a plurality of eleventh apertures and the faceplate is formed with a plurality of twelfth apertures corresponding to the eleventh apertures for coupling by fasteners.

11. The hardware retainer according to claim 8, wherein the securing plate is formed with a plurality of tenth apertures corresponding to the ninth apertures for coupling by fasteners.

12. The hardware retainer according to claim 11, wherein the securing plate is formed with a plurality of eleventh apertures and the faceplate is formed with a plurality of twelfth apertures corresponding to the eleventh apertures for coupling by fasteners.

13. The hardware retainer according to claim 1, wherein the tray is formed with four thirteenth apertures respectively disposed at four corners thereof.

* * * * *